United States Patent [19]
Arima et al.

[11] Patent Number: 5,141,891
[45] Date of Patent: Aug. 25, 1992

[54] MIS-TYPE SEMICONDUCTOR DEVICE OF LDD STRUCTURE AND MANUFACTURING METHOD THEREOF

[75] Inventors: Hideaki Arima; Natsuo Ajika, both of Hyogo, Japan

[73] Assignee: Mitsubishi Denki Kabushiki Kaisha, Tokyo, Japan

[21] Appl. No.: 777,498

[22] Filed: Oct. 17, 1991

Related U.S. Application Data

[62] Division of Ser. No. 432,426, Nov. 6, 1989.

[30] Foreign Application Priority Data

Nov. 9, 1988 [JP] Japan ................. 63-284404

[51] Int. Cl.⁵ .......................... H01L 21/265
[52] U.S. Cl. ............................ 437/44; 437/40; 437/41; 437/45; 437/907; 437/984; 357/23.4
[58] Field of Search ............. 357/23.4, 23.3; 437/44, 437/45, 41, 40, 907, 984

[56] References Cited

U.S. PATENT DOCUMENTS

| | | | |
|---|---|---|---|
| 4,441,931 | 4/1984 | Levin | 437/44 |
| 4,577,392 | 3/1986 | Peterson | 437/44 |
| 4,845,046 | 7/1989 | Shimbo | |
| 4,977,100 | 12/1990 | Shimura | 437/44 |
| 5,008,209 | 4/1991 | Appels et al. | 437/44 |

FOREIGN PATENT DOCUMENTS

| | | | |
|---|---|---|---|
| 56-147466 | 11/1981 | Japan | |
| 61-53774 | 3/1986 | Japan | 437/44 |
| 62-122170 | 6/1987 | Japan | |
| 62-122273 | 6/1987 | Japan | |
| 62-145776 | 6/1987 | Japan | |
| 0122174 | 5/1988 | Japan | 357/23.3 |

OTHER PUBLICATIONS

"A MOS Transistor with Self-Aligned Polysilicon Source-Drain", Hoang et al.; May 1986: pp. 314-316.
K. Tsuskamoto et al., "Double Stacked Capacitor with Self-Aligned Poly Source/Drain Transistor (DSP) Cell for Megabit Dram", IEDM 87 (1987) pp. 328-331.
C. Oh & C. Kim "A New MOSFET Structure with Self-Aligned Polysilicon Source & Drain Electrodes", IEEE Electron Device Letters, vol. EDL-5, No. 10 (Oct. 1984), pp. 400-402.
C. Chang & J. Lien, "Corner-Field Induced Drain Leakage in Thin Oxide MOSFETs", IEDM (1987), pp. 714-717.
T. Huang et al., "A MOS Transistor with Self-Aligned Polysilicon Source-Drain", IEEE Electron Device Letters, vol. EDL-7, No. 5 (May 1986), pp. 314-326.

Primary Examiner—Brian E. Hearn
Assistant Examiner—Kevin M. Picardat
Attorney, Agent, or Firm—Lowe, Price, LeBlanc & Becker

[57] ABSTRACT

An MIS-type semiconductor device comprises PSD structure and LDD structure. The LDD structure comprises high concentration impurity regions formed by thermally diffusing impurities which have been contained in source/drain electrode conductive layers made of polysilicon onto a semiconductor substrate, and low concentration impurity regions formed through ion implantation using resist patterned on channel regions and the source/drain electrode conductive layers as mask. A gate electrode is formed, after formation of the low concentration impurity regions, to cover them and have its edges overlap the source/drain electrode conductive layers. The LDD structure suppresses the short channel effects which might be caused in the MIS-type semiconductor device and thus enables channels length to be miniaturized while the PSD structure enables also miniaturization of source/drain structure.

10 Claims, 6 Drawing Sheets

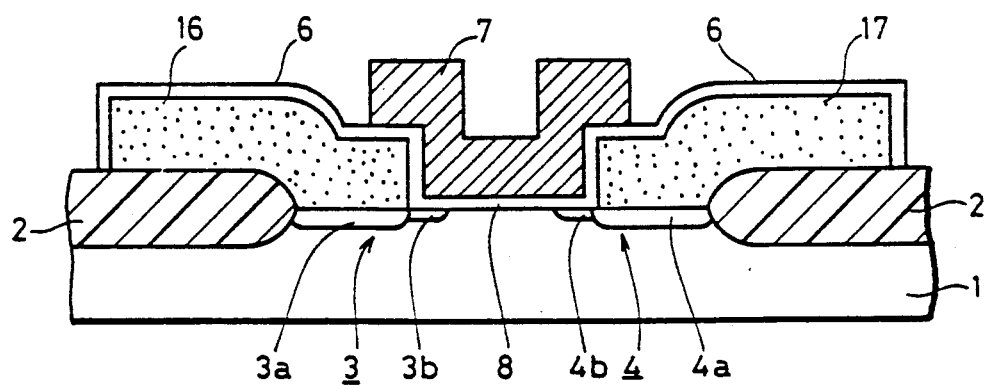
FIG.1
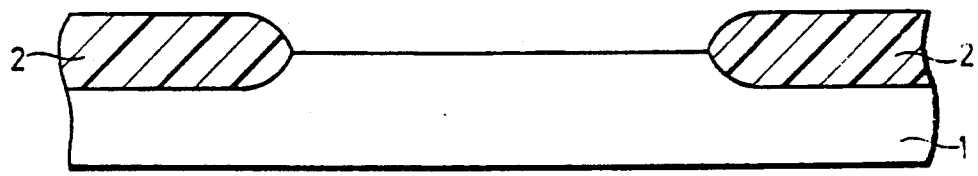
FIG.2A
FIG.2B
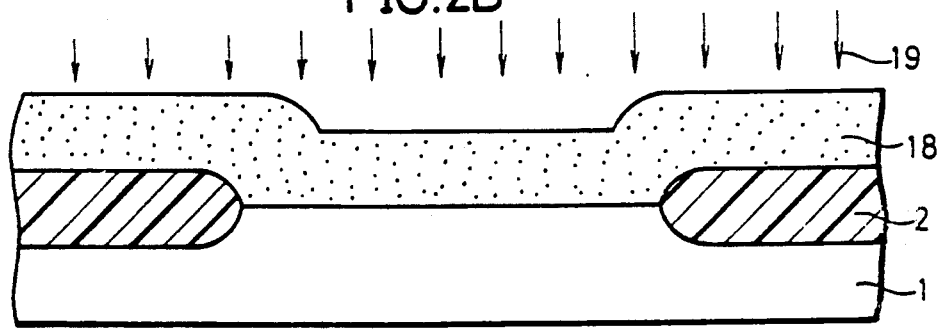
FIG.2C
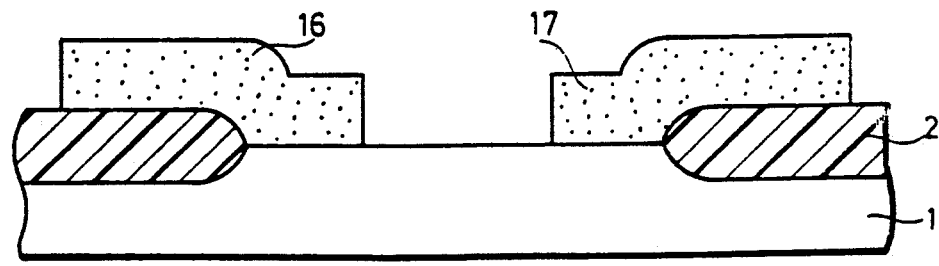

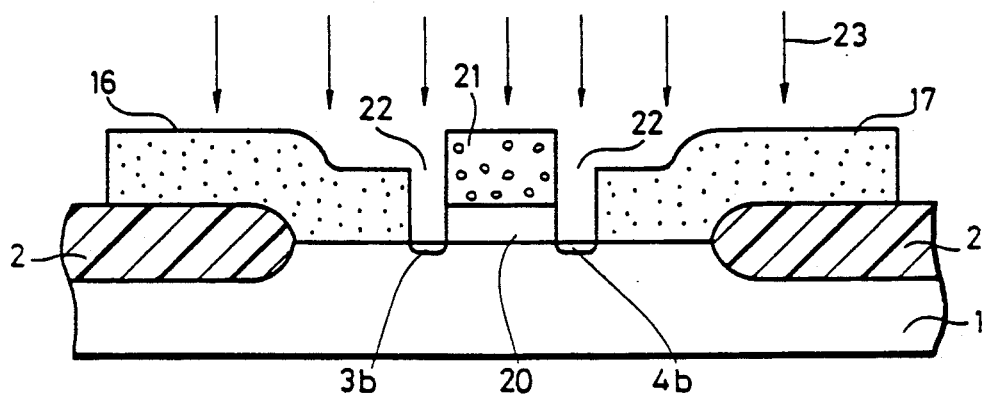
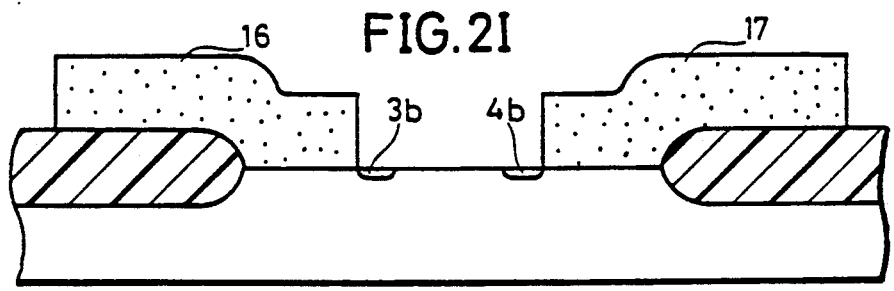
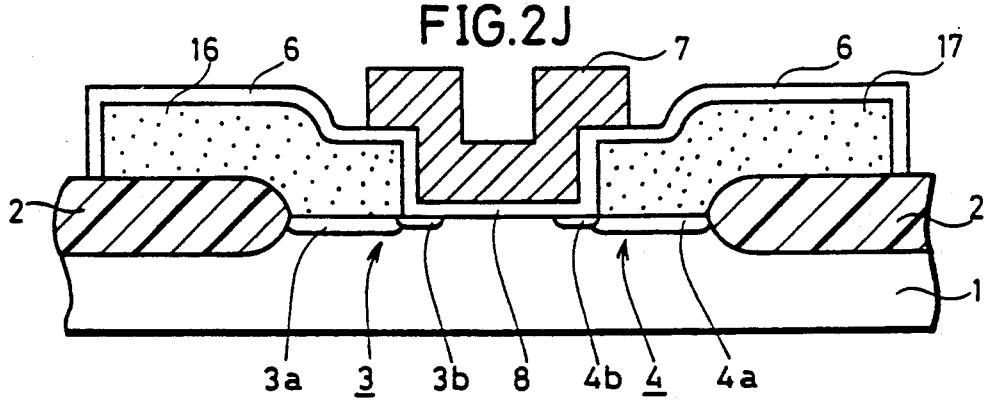

MIS-TYPE SEMICONDUCTOR DEVICE OF LDD STRUCTURE AND MANUFACTURING METHOD THEREOF

This application is a division of application Ser. No. 07/432,426 filed Nov. 6, 1989.

BACKGROUND ART 1. Field of the Invention

The present invention relates generally to semiconductor devices, and more particularly, to improvements in source-drain structure of the MIS type semiconductor devices.

2. Description of the Background Art

As structure of semiconductor devices gets more and more miniaturized, the gate length of an MOS (Metal Oxide Semiconductor) transistor has been required to be 1μm or less. In such a miniaturized structure, diffusion depth of source/drain regions has been made shallower, or a gate insulating film has been thinned according to the reduction of the gate length so as to suppress any degradation in characteristics which might be seen in a miniaturized transistor. As a result, an enhanced driving ability thereof has been obtained. Supply voltage for driving such MOS transistors, however, has not been reduced, but kept at a definite value, for example, at 5V, as in conventional cases. Therefore, electrical fields in devices were increased due to the miniaturized device structure such as in a transistor, which has brought about a problem of degradation in characteristics caused by hot carriers. Particularly, underneath gate electrodes in the vicinity of drain regions there was concentrated an internal electrical field so that the hot carriers are injected in a gate oxide film, generating trap state or interface state, which has led to such problems as fluctuation in the threshold voltage of transistors or reduction in current gain.

As one method for reducing the hot electron phenomenon, it has been attempted to weaken the electrical field in the vicinity of drain regions by attaining a smooth distribution of impurities in the drain regions. More specifically, the method may employ the so-called DDD (Double Diffused Drain) structure in which arsenic of a higher concentration and phosphorous of a lower concentration are doubly diffused in source/drain diffusion layers, or the LDD (Lightly Doped Drain) structure in which diffusion areas of a lower concentration is formed in drain regions underneath gate electrodes.

When a comparison is made between the two cases above, the DDD structure is simpler with respect to its manufacturing process. Meanwhile, by comparing them in their capability of suppressing the short channel effects which might be caused by the miniaturization, or in their electric properties such as resistivity or leakage current, it has been known that the LDD structure is superior to the other. This is described, for example, in "IEEE, IEDM 87, pp. 714–717".

Since the standard LDD structure involves, however, some problems as will be described below, an improved LDD structure has been contrived. More specifically, the standard LDD structure has $n^+$ impurity regions of drain regions formed under sidewall oxide films of gate electrodes. Therefore, underneath the gate electrodes there is only partial encroachment of the $n^-$ impurity regions which have expanded through lateral diffusion. In such a structure, a part of the hot carriers generated in the vicinity of the drains is trapped in the sidewall oxide films. This results in the problems of increased resistivity in the $n^-$ impurity regions and decreased current gain. Meanwhile, the improved LDD structure has $n^-$ impurity regions embedded underneath gate electrodes to avoid the problems above.

Furthermore, a structure called PSD (Poly Silicon Source Drains) transistor which has applied a polysilicon layer to source/drain regions has been proposed for a submicron transistor. In the PSD transistor, the source/drain regions are formed through impurity diffusion from the overlaid polysilicon layer to the substrate. According to such a method, it is possible to make diffusion depth of the impurities in the semiconductor substrate significantly shallow to a degree of about $0.1\mu m$. Additionally, by utilizing a polysilicon layer extending over the field regions, it is possible to make a contact with source/drain regions on the field regions. This enables the reduction of the occupied plane area of a transistor, which characterizes the PSD transistor.

Now, with reference to FIG. 3, a structure of the conventional PSD transistor will be described. The PSD transistor as shown in FIG. 3 is described, for example, in "IEEE ELECTRON DEVICE LETTERS Vol 1 EDL-7 No. 5 pp. 314–316, 1986. At a surface of a silicon substrate 1 there is formed a field oxide film 2. Furthermore, at another surface of the silicon substrate 1, there are formed source/drain regions 3 and 4 at predetermined intervals in which impurities of the opposite conductivity type with respect to the silicon substrate 1 have been added. On the surfaces of the source/drain regions 3 and 4, a polysilicon layer 5 extends over the field oxide film 2. On the surface of the silicon substrate 1 lying between the source/drain regions 3 and 4, there is formed a gate electrode 7 with a gate oxide film 8 interposed therebetween. The source/drain regions 3 and 4 are of the so-called DDD structure or double diffused structure which has been formed through diffusion of the high concentration arsenic and the low concentration phosphorous both added to the polysilicon layer 5.

Meanwhile, as described above, the LDD structure should be preferably employed in a short channel transistor with respect to impurity distribution in source/drain regions, rather than the DDD structure. Moreover, it is further desirable to employ the improved LDD structure which has $n^-$ impurity regions on the drain side embedded underneath gate electrode.

As has been described in the foregoing, it is preferably required to implement an MOS transistor provided with good transistor properties and capable of accepting a miniaturized structure as a PSD transistor with the improved LDD structure.

In attempting to embody a PSD transistor of the LDD structure with the application of the well-known art, it has turned out impossible to implement the same with the aid of any existing technology due to the following various drawbacks and problems.

In the following, the features and problems of the LDD structure will be described in connection with three conventional examples.

Initially, the first example will be described with reference to FIGS. 4 and 5. The present example is described, for example, in the Japanese Patent Laying-Open No. 62-122170. FIG. 4 is a cross sectional view of a LDD MOS transistor according to the present example. The source/drain regions 3 and 4 are of the LDD structure comprising high concentration $n^+$ impurity regions $3a$ and $4a$ and $n^-$ impurity regions $3b$ and $4b$ adjacent thereto. This LDD structure is formed as follows. Referring to FIG. 5, after a gate oxide film 8 and a gate electrode 7 are patterned to have a predetermined configuration, arsenic is implanted to surface of a silicon substrate 1 to a higher concentration through the channeling direction. In this channeling ion implantation, the implanted ions will not substantially extend in lateral directions. Subsequently, with a tilt of about 7° as ion injection angle with respect to the surface of the silicon substrate 1, phosphorous is implanted to a lower concentration. In this random direction ion implantation, the ions extend laterally to about 0.05μm underneath the gate electrode 7. Thereafter, a proper heat treatment is applied thereby to complete the LDD structure which has an $n^-$ impurity layer 3b, 4b of a lower concentration extending underneath the gate electrode 7.

This first conventional example is characterized by the first that the ion implantation is performed twice, i.e. first in the channeling directions and second in the random directions, and then difference in degree of the lateral extensions of the impurity ions is utilized to constitute the LDD structure. To cause channeling, it is required for the silicon substrate surface to be directly exposed. For example, if a polysilicon layer, an oxide film or the like have been formed on the silicon substrate surface, then, implanted ions are scattered while passing through the stacked layers such as the polysilicon layer in case of the ion implantation in channeling directions for the silicon substrate surface, so that channeling will not occur. This means that the channeling ion implantation can not be performed on the PSD transistor because there always exists a polysilicon layer on the surface of the silicon substrate 1. Furthermore, in the channeling ion implantation, while the lateral extension of impurity ions is negligible, the impurity ions reach to a depth more than several times that in the random ion implantation case. This makes it difficult to implement a shallower diffusion layer which is desired for a transistor of miniaturized structure. Furthermore, since the lateral extension of the low concentration diffusion layer is made by a secondary effect caused by ion scattering in the random ion implantation, the vertical and lateral extensions of the impurities cannot be determined independently of each other.

Next, the second example will be described with reference to FIGS. 6, 7A and 7B. The present example is described in Japanese Patent Laying-Open No. 62-122273. In FIG. 6, a cross sectional view of a LDD MOS transistor according to the present example is shown. Referring to FIG. 6, source/drain regions 3 and 4 are of a LDD structure comprising high concentration $n^+$ impurity regions 3a and 4a, and low concentration $n^-$ impurity regions 3b and 4b. This LDD structure is constituted according to the processes shown in FIGS. 7A and 7B. More specifically, as shown in FIG. 7A, a second film 10 and a resist 11 both patterned to have a predetermined configuration formed on surface of a polysilicon layer 9 on a silicon substrate 1. With the resist 11 and the second film 10 as mask, impurities are ion implanted in surface of the silicon substrate 1 to form low concentration $n^-$ impurity regions 3b and 4b. After removing the resist 11, as shown in FIG. 7B, a CVD (Chemical Vapor Deposition) oxide film is deposited thereover, and anisotropic etching such as reactive ion etching is performed to form sidewalls 12 on either side of the second film 10. Furthermore, with the second film 10 having the sidewalls formed on either side as mask, the polysilicon layer 9 is etched to form a gate electrode 7. Thereafter, impurities are ion-implanted in surface of the silicon substrate 1 with the gate electrode 7 as mask to form high concentration $n^+$ impurity regions 3a and 4a.

In this second example, the ion implantation for forming the $n^-$ impurity regions 3b and 4b is performed through the gate oxide film 8 and the polysilicon layer 9. Therefore, the ion implantation damages are induced in the gate oxide film 8. The damages cause the gate oxide film 8 to increase its trap state and reduce its dielectric strength or breakdown voltage. In order to attain a highly reliable transistor, therefore, use of the gate oxide film damaged by ion implantation should be preferably avoided.

The third example will be now described. This example is described in Japanese Patent Laying-Open No. 62-14776. FIGS. 8A and 8B are cross sectional views showing main manufacturing processes of a LDD MOS transistor according to the present example. As shown in FIG. 8A, an oxide film 13 including impurities of a high concentration is formed on a silicon substrate 1 to have a predetermined configuration through patterning. Sidewalls 14 including impurities of a low concentration are further formed on sides of the oxide film 13. Thereafter, a gate oxide film 15 is formed.

Subsequently, as shown in FIG. 8B, a gate electrode 7 of a predetermined configuration is formed. A proper heat treatment is then applied to thermally diffuse out the high concentration impurities contained in the oxide film 13 and the low concentration ones contained in the sidewalls 14 to the substrate. As a result, source/drain regions 3 and 4 of a LDD structure comprising both high concentration impurity regions 3a and 4a, and low concentration impurity regions 3b and 4b are formed.

In the present example, the thermal diffusion method is used to form impurity regions. Therefore, the extensions of the low concentration impurity regions 3b and 4b underneath the gate electrode 7 are formed through the lateral diffusion of impurities. Furthermore, there exists the disadvantage that the impurity concentrations and diffusion length in lateral and vertical directions of the source/drain regions 3 and 4 cannot be controlled independently.

As has been described above, it is difficult to attain the improved LDD structure of the PSD transistor by the existing methods.

SUMMARY OF THE INVENTION

An object of the present invention is to provide an MIS-type semiconductor device which can effectively suppress the short channel effects and accept high integration.

Another object of the present invention is to provide an MIS-type semiconductor device comprising both the so-called PSD transistor structure and the LDD structure.

Still another object of the present invention is to form low concentration impurity regions constituting the LDD structure underneath a gate electrode.

Further object of the present invention is to provide a manufacturing method of an MIS-type semiconductor device comprising the PSD transistor structure and the LDD structure.

Still another object of the present invention is to form high concentration impurity regions and low concentration impurity regions constituting the LDD structure together, through separate processes while controlling the dimensions thereof.

The MIS-type semiconductor device according to the present invention is of a structure that one conductive layer for electrode rides on another, and comprises a semiconductor substrate including a main surface, impurity regions of first and second conductivity types, a first electrode conductive layer stacked on a surface of the first conductivity type impurity region and a second electrode conductive layer stacked on a surface of the second conductivity type impurity region, and an insulating film formed between the first electrode conductive layer and the second electrode conductive layer. The second electrode conductive layer is of a structure that it partially rides on surface of the first electrode conductive layer with the insulating film interposed therebetween. Furthermore, the first conductivity type impurity region comprises an impurity region of a relatively high concentration which is self-aligned with the first electrode conductive layer and another impurity region of a relatively low concentration adjacent thereto and extending underneath the second electrode conductive layer.

Further according to another aspect of the present invention, the manufacturing method of the MIS type semiconductor device comprises the following processes.

a. Process of forming a first polysilicon layer including impurities on a semiconductor substrate.

b. Process of etching the first polysilicon layer and forming a predetermined opening to reach the semiconductor substrate.

c. Process of forming a first insulating film on the bottom and inner surfaces of the predetermined opening and on the first polysilicon layer.

d. Process of applying resist to the first insulating film.

e. Process of etching the resist to leave it only in the areas covering the portions of the first insulating film which have been formed to contact with only the bottom and the side surfaces of the opening.

f. Process of etching the first insulating film with the resist as mask and forming through portions to reach the semiconductor substrate surface at least between the first polysilicon layer and the resist.

g. Process of introducing impurities into the semiconductor substrate through the through portions to form impurity regions of a low concentration.

h. Process of removing the resist and first insulating film formed in the opening.

i. Process of diffusing the impurities contained in the first polysilicon layer into the semiconductor substrate to form impurity regions of a high concentration.

j. Process of forming a second insulating film on the bottom and inner surfaces of the opening and on the first polysilicon layer surface.

k. Process of forming a second polysilicon layer on the second insulating film surface and patterning it to be of a configuration that the second polysilicon layer partially rides on the first polysilicon layer.

Impurity regions and interconnection layers to be interconnected thereto have been hitherto directly connected through a contact hole formed in an interlayer insulating film. Such a connecting method has required the impurity regions to be formed with some margin in its diffusion width so as to reduce contact resistance between the impurity regions and the interconnection layers, or to achieve alignment between the impurity regions and the contact hole.

The MIS type semiconductor device according to the present invention comprises a conductive layer for electrode in direct contact with upper surface of an impurity region and extending as far as it covers an insulating film for element isolation. Contact between the impurity region and an interconnection layer is made above the field insulating film through the electrode conductive layer. The impurity region is connected to the electrode conductive layer in areas large enough and not directly to the interconnection layer. Therefore, the impurity region can reduce its width by the margin which might be left for connection with the interconnection layer. Accordingly, the impurity region can be miniaturized in the diffusion width. In addition, with the partial ride-on structure of the second electrode conductive layer, the channel region can be reduced in width while maintaining its effective conducting cross section.

Furthermore, the miniaturized device structure generally results in reduced channel length to increase an electrical field in vicinity of impurity regions, which has brought about a serious problem of generating so-called short channel effects. The MIS type semiconductor device according to the present invention, however, constitutes the so-called LDD structure comprising impurity regions of a double structure made up of one impurity region of a relatively high concentration and another impurity region of a relatively low concentration adjacent thereto, and allowing a smooth concentration distribution for impurities. As a result, the enhanced electrical fields accompanying the short channel length is reduced thereby to suppress generation of the short channel effects, so that reduction of the channel length is effected.

Thus, the MIS type semiconductor device according to the present invention has combined a structure utilizing an electrode conductive layer formed on surface of an impurity region to make a connection to an interconnection layer, another structure in which a conductive layer for gate electrode formed on a channel region partially rides on the electrode conductive layer, and the so-called LDD structure of impurity regions so that a structure allowing a miniaturized device structure while suppressing the short channel effects and the like is obtained.

Furthermore, according the manufacturing method of the MIS type semiconductor device, a part of an oxide film formed on a semiconductor substrate is inverted to openings by etch back method and selective etching, through which impurities are introduced in the semiconductor substrate. Therefore, control of the oxide film thickness enables impurity regions to be controlled in width and this will be suitable for fine processing. Additionally, since after formation of impurity regions, a second electrode conductive layer is formed thereon, a positional relationship where the impurity regions and the second electrode conductive layer are partially overlapped each other can be readily established.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross sectional view of a PSD transistor according to the present invention.

FIGS. 2A, 2B, 2C, 2D, 2E, 2F, 2G, 2H, 2I and 2J are cross sectional views showing successive processes of manufacturing method of the PSD transistor shown in FIG. 1.

DESCRIPTION OF THE PREFERRED EMBODIMENTS

Figure 2D:
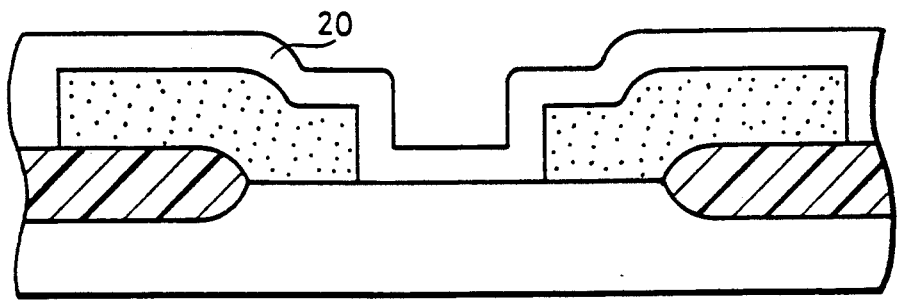

Referring to FIG. 1, a PSD transistor has a field oxide film 2 formed of a thick oxide film for isolating elements in predetermined areas on main surface of a silicon substrate 1. Furthermore, at the surface of the silicon substrate 1 between the field oxide films 2, there are formed a source region 3 and a drain region 4 spaced apart from each other. The source and drain regions 3 and 4 constitute the so-called LDD structure comprising $n^+$ impurity regions $3a$ and $4a$ of a relatively high concentration and $n^-$ impurity regions $3b$ and $4b$ of a relatively low concentration. On surfaces of the source and drain regions 3 and 4 there are formed conductive layers 16 and 17 for source and drain electrodes made of polysilicon. The source and drain electrode conductive layers 16 and 17 are formed to extend as far as they cover tops of the field oxide films 2. Furthermore, the source and drain electrode conductive layers 16 and 17 have one or several kinds of impurities added which have the opposite conductivity type with respect to the silicon substrate 1. Additionally, the source and drain electrode conductive layers 16 and 17 are connected with interconnection layers (not shown) on the field oxide film 2. Furthermore, a gate electrode 7 is formed on surface of the silicon substrate 1 with a gate oxide film 8 interposed therebetween. The gate electrode 7 is constituted as partially riding on the source and drain electrode conductive layers 16 and 17 with an insulating film 6 interposed therebetween. The portion of the gate electrode 7 which lies over the gate oxide film 8 is formed to be in a positional relationship as partially covering the $n^{31}$ impurity regions $3b$ and $4b$ of the source/drain regions 3 and 4. Thus, the transistor shown in FIG. 1 comprises the so-called PSD transistor structure including the source/drain electrode conductive layers 16 and 17 formed of polysilicon, and the so-called LDD structure. The PSD transistor structure allows the transistor to be miniaturized with respect to its structure while the LDD structure reduces the short channel effects as might be caused by the miniaturization. Therefore, combination of these two structures makes it possible to attain a fine structure transistor while maintaining its high reliability.

Subsequently, manufacturing processes of the PSD transistor shown in FIG. 1 will be described with reference to the drawings. FIGS. 2A through 2J are cross sectional views showing manufacturing processes of the PSD transistor above.

First, referring to FIG. 2A, a field oxide film 2 for isolating elements is formed in predetermined areas on main surface of a p-type silicon substrate 1 by LOCOS (Local Oxidization of Silicon) method.

Secondly, as shown in FIG. 2B, a polysilicon layer 18 is deposited on surfaces of the p-type silicon substrate 1 and the field oxide film 2 by CVD (Chemical Vapor Deposition) method. N-type impurity ions 19 are then ion-implanted in the polysilicon layer 18. As the n-type impurity ions 19, for example, phosphorous (P) or arsenic (As) can be applied.

Thirdly, as shown in FIG. 2C, the polysilicon layer 18 is patterned to have a predetermined configuration by photolithography and etching. As a result, a conductive layer 16 for source electrode and another conductive layer 17 for drain electrode are formed.

Furthermore, as shown in FIG. 2D, a silicon oxide film 20 is deposited on surfaces of the silicon substrate 1 and the source/drain electrode conductive layers 16 and 17 by CVD method. The thickness of this silicon oxide film 20 is significant for definition of the overlapped areas between the diffusion widths of the $n^-$ impurity regions $3b$ and $4b$ and the gate electrode 7 in the subsequent process. A description will be made later on this film thickness.

Figure 2E:
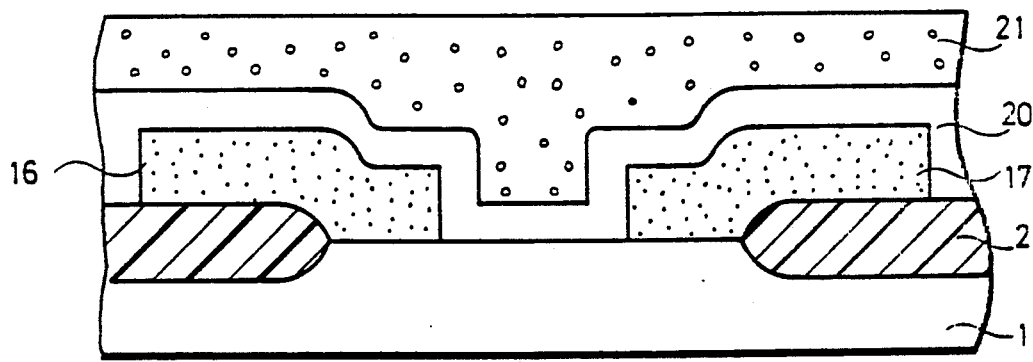

Subsequently, as shown in FIG. 2E, a photoresist 21 is applied on surface of the silicon oxide film 20. The photoresist 21 is heavily applied so as to planarize its surface.

Figure 2F:
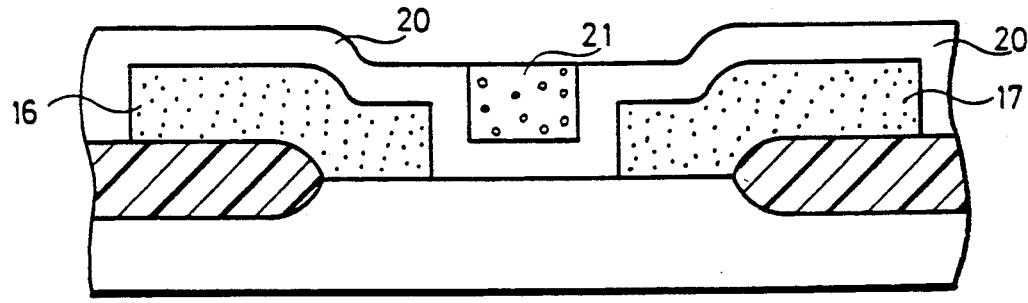

Thereafter, as shown in FIG. 2F, the photoresist 21 is etched back to expose surfaces of the silicon oxide film 20. This etch back process is carried out specifically to expose the surfaces of the silicon oxide film 20 lying between the source electrode conductive layer 16 and the drain electrode conductive layer 17.

Figure 2G:
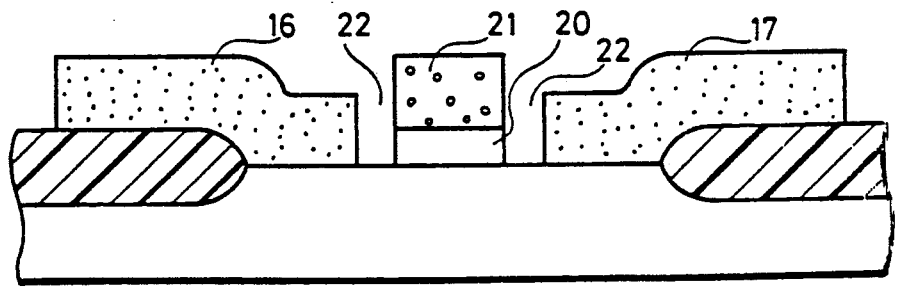
Figure 3:
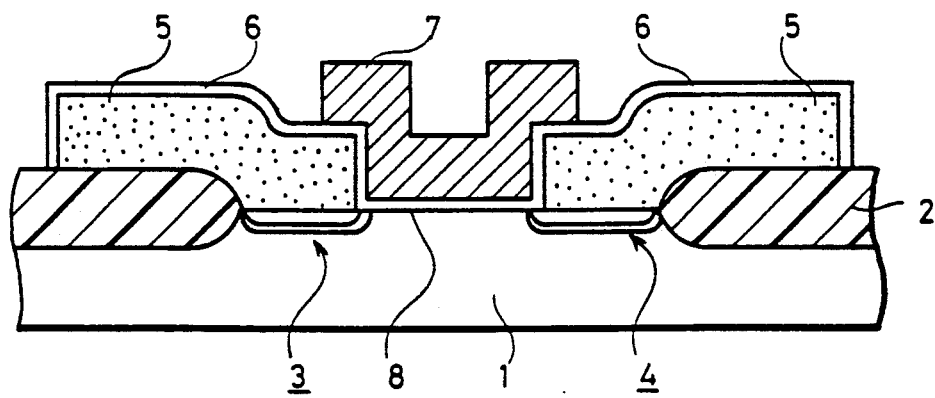
FIG. 3 is a cross sectional view of a conventional PSD transistor.
Figure 4:
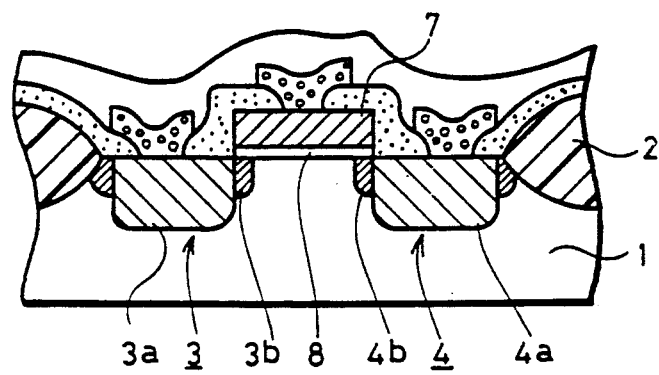
FIG. 4 is a cross sectional view of a conventional so-called gate overlap type LDD transistor.
Figure 5:
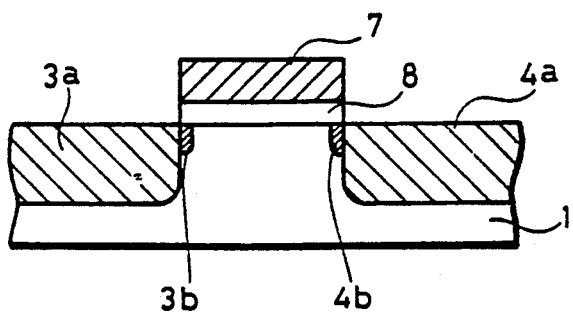
FIG. 5 is a cross sectional view for explaining a process to form impurity regions in the LDD transistor shown in FIG. 4.
Figure 6:
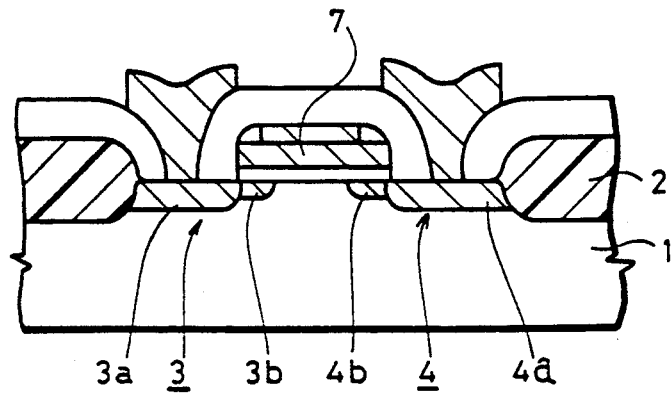
FIG. 6 is a cross sectional view showing another conventional gate overlap type LDD transistor.
Figure 7A:
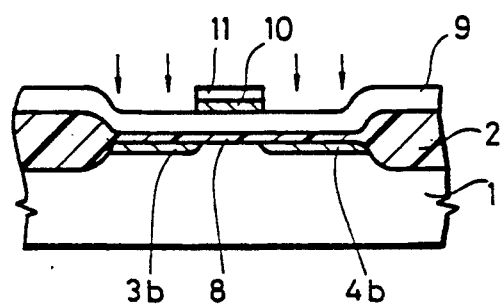
FIGS. 7A and 7B are cross sectional views showing main manufacturing processes of the transistor shown in FIG. 6.
Figure 7B:
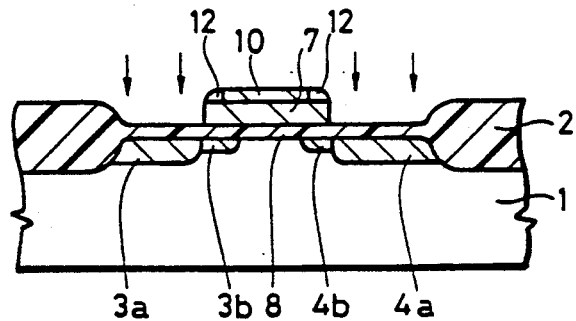
Figure 8A:
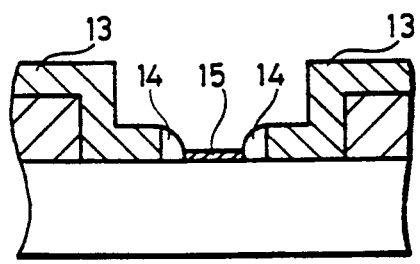
FIGS. 8A and 8B are cross sectional views of still another gate overlap type LDD transistor showing main manufacturing processes.
Figure 8B:
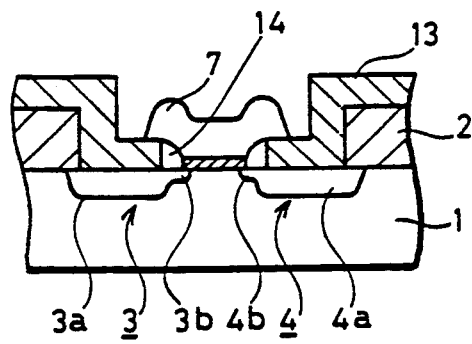

Subsequently, as shown in FIG. 2G, following the etch back process above, the silicon oxide film 20 is etched away with a remaining photoresist 21 as mask thereby forming openings 22 between the photoresist 21 and the source and drain electrode conductive layers 16 and 17 to reach surfaces of the silicon substrate 1. Wet etching using hydrofluoric acid-based solution or plasma etching is employed for this etching process.

Furthermore, as shown in FIG. 2H, n-type impurity ions 23 are ion-implanted in surfaces of the p-type silicon substrate 1 with the photoresist 21 and the source/drain electrode conductive layers 16 and 17 as mask. The n-type impurity ions 23 are implanted in the surfaces of the silicon substrate 1 through the openings 22 and 22 formed between the photoresist 21 and the source/drain electrode conductive layers 16 and 17. As a result, $n^-$ impurity regions $3b$ and $4b$ of a low concentration are formed to constitute the source/drain regions 3 and 4 of the transistor. The diffusion width of these $n^-$ impurity regions $3b$ and $4b$ depends on opening width of the openings 22. In other words, it will be defined by film thickness of the silicon oxide film 20 deposited in the process described with reference to FIG. 2D.

Furthermore, as shown in FIG. 2I, the photoresist 21 and the silicon oxide film 20 formed between the source/drain electrode conductive layers 16 and 17 are etched away.

Then, as shown in FIG. 2J, a gate oxide film 8 is formed on a surface of the silicon substrate 1 by thermal oxidation method while on surfaces of the source/drain electrode conductive layers 16 and 17, an insulating film 6 of a thickness larger than that of the gate oxide film 8 is formed. The source/drain electrode conductive layers 16 and 17 contain the n-type impurities as described above. These impurities facilitate reaction for forming an oxide film on surfaces of the source/drain electrode conductive layers 16 and 17 made of polysilicon. Therefore, one thermal oxidation process can form the gate oxide film 8 to be relatively thin and the insulating film 6 to be relatively thick at a time. Subsequently, a heat treatment is applied to thermally diffuse the n-type impurities contained in the source/drain electrode conductive layers 16 and 17 into the p-type silicon substrate 1. This process results with the n+ impurity regions 3a and 4a of a relatively high concentration to form the source/drain regions 3 and 4.

Furthermore, a polysilicon layer is deposited on surfaces of the gate oxide film 8 and the insulating film 6 and then patterned to have a predetermined configuration by photolithography and etching. A gate electrode 7 is formed through this patterning process. The overlapped areas between the gate electrode 7 and the n− impurity regions 3b and 4b are defined by thickness of the insulating film 6 formed on side surfaces of the opening between the source/drain electrode conductive layers 16 and 17. In other words, this overlapped amount is defined by difference between thickness of the insulating film 6 and width of the above mentioned opening 22. Accordingly, the so-called gate overlap type LDD structure formed by the manufacturing method above can be formed to be a desired one by controlling difference in film thickness between the silicon oxide film 20 formed by the process shown in FIG. 2D and the insulating film 6 formed by the process shown in FIG. 2J.

Meanwhile, after the process shown in FIG. 2J, additional processes of forming an interlayer insulating film and connecting the source/drain electrode conductive layers 16 and 17 to interconnection layers (drawings thereof are omitted here).

Thus, in the manufacturing method of the PSD transistor according to the present invention, the patterned silicon oxide film formed to a predetermined thickness is inverted to openings through etch back method and selective etching. Further, impurities are introduced in the silicon substrate through these openings. According to such a method, it is possible to positively control diffusion width of the impurity regions. Furthermore, with the subsequent manufacturing processes for the insulating film 6 and the gate electrode 7, the gate overlap type PSD transistor structure can be readily manufactured.

While in the above embodiment, description has been made on the case where the transistor structure is formed on the p-type silicon substrate 1, such a transistor structure may be formed also, for example, using p-type well regions formed on the silicon substrate.

Further, though an n-channel transistor has been described in the above embodiment, it will be apparent that the present invention can be also applied to a p-channel transistor.

As has been described in the foregoing, according to the present invention, a transistor structure is constituted as combining the so-called PSD transistor structure in which a gate electrode structure partially rides on electrode conductive layers formed on surfaces of impurity regions, with the so-called LDD structure comprising high concentration impurity regions and low concentration impurity region which have been offset each other. Accordingly, a semiconductor device capable of accepting a miniaturized device structure can be attained without bringing about any evil influences as might be attendant on the miniaturization of device structure, such as the short channel effects.

Additionally, according to the semiconductor device manufacturing method of the present invention, the so-called gate overlap type LDD transistor can be readily manufactured by the processes of forming impurity regions in a substrate with the use of openings which have been formed by inverting a part of an oxide film formed on the silicon substrate, and then constituting a gate electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device, comprising the steps of:
    forming a first polysilicon layer on a semiconductor substrata, and having a portion formed integrally throughout in contact with said semiconductor substrate;
    etching said first polysilicon layer and forming a predetermined first opening to reach said semiconductor substrate;
    forming a first insulating layer on the bottom and inner surfaces of said predetermined first opening and on said first polysilicon layer,,
    applying a mask layer on said first insulating layer;
    etching said mask layer to leave only a portion thereof covering the bottom and at least part of the sidewall surfaces of the opening in said first insulating layer;
    etching said first insulating layer with said mask layer and forming second openings to reach said semiconductor substrate surfaces at least between said first polysilicon layer and said mask layer;
    introducing impurities in said semiconductor substrate through said second openings to form impurity regions of a low concentration;
    removing said mask layer and first insulating layer formed in said first opening;
    thermally diffusion the impurities through said first polysilicon layer into said semiconductor substrate to form impurity regions of a high concentration corresponding to unetched segments of said portion of said first polysilicon layer;
    forming a second insulating layer on the bottom and inner surfaces of said first opening and on the surface of said first polysilicon layer; and
    forming a second polysilicon layer on surface of said second insulating layer and patterning said second polysilicon layer to partially ride on said first polysilicon layer.

2. The manufacturing method of an MIS-type semiconductor device according to claim 1, wherein
    the step of forming said low concentration impurity regions is carried out by an ion implantation method with said patterned first polysilicon layer and said resistant as mask.

3. The manufacturing method of an MIS-type semiconductor device according to claim 1, wherein said first polysilicon layer comprises doped polysilicon; and the step of forming said high concentration impurity regions is carried out by thermally diffusion the impurities contained in said first polysilicon layer into said semiconductor substrate through heat treatment.

4. The manufacturing method of an MIS-type semiconductor device according to claim 1, wherein the step of forming said second insulating layer is carried out by a thermal oxidation process.

5. The manufacturing method of an MIS-type semiconductor device according to claim 1, wherein said first insulating layer is formed to have a thickness sufficient to allow said low concentration impurity regions to attain widths of a predetermined value in a lateral direction of said semiconductor substrate, and a thickness greater than that of said second insulating layer formed later in said method.

6. A method of making a transistor; comprising the steps of:

forming a first layer of a material on a semiconductor substrate;

etching said first layer and forming a predetermined first opening to reach said semiconductor substrate;

forming a second layer of a prescribed thickness on the bottom and inner surfaces of said predetermined first opening and on said first layer of material;

applying a third layer on said second layer;

etching said third layer to leave only a portion thereof covering the bottom and at least part of the sidewall surfaces of the predetermined first opening;

etching said second layer with said third layer as a mask and forming second openings to reach said semiconductor substrate surfaces at least between said first layer of material and said third layer;

introducing impurities in said semiconductor substrate surfaces at least between said first layer of material and said third layer;

introducing impurities in said semiconductor substrate through said second openings to form source and drain impurity regions;

removing said third layer and second layer formed in said predetermined first opening;

forming a first insulating layer on the bottom and inner surfaces of said predetermined first opening and on the surface of said first layer of material; and forming a gate electrode on the surface of said first insulating layer.

7. The method of claim 6, wherein said second layer is formed to have a thickness sufficient to allow said source and drain impurity regions to attain widths of a predetermined value in a lateral direction of said semiconductor substrate, and the thickness of said first insulating layer is less than the thickness of the first layer to achieve a gate overlap structure.

8. The method of claim 6, wherein the first layer of material comprises doped impurities, the step of introducing impurities in said semiconductor substrate forms source and drain impurity regions of low concentration, and subsequent to the step of removing said third and second layers, thermally diffusing said impurities through said first layer of material into said semiconductor substrate to form source and rain impurity regions of high concentration adjacent the source and drain impurity regions of low concentration.

9. The method of claim 6, wherein the step of introducing impurities into said semiconductor substrate is carried out by ion implantation with said first and third layers as a mask.

10. The method of claim 6, wherein the step of forming said first insulating layer is carried out by a thermal oxidation process.

* * * * *